United States Patent
Ueda et al.

(10) Patent No.: US 8,957,697 B2
(45) Date of Patent: Feb. 17, 2015

(54) CIRCUIT BOARD, IMAGE FORMING APPARATUS, AND METHOD OF MANAGING REUSE INFORMATION OF CIRCUIT BOARD

(75) Inventors: Yuichiro Ueda, Kanagawa (JP); Noriaki Orikasa, Kanagawa (JP); Takashi Nishizawa, Kanagawa (JP); Shugo Okamura, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 358 days.

(21) Appl. No.: 13/413,742

(22) Filed: Mar. 7, 2012

(65) Prior Publication Data
US 2012/0235703 A1 Sep. 20, 2012

(30) Foreign Application Priority Data

Mar. 18, 2011 (JP) .................................. 2011-061453
Dec. 5, 2011 (JP) .................................. 2011-266025

(51) Int. Cl.
*H05K 1/02* (2006.01)
(52) U.S. Cl.
CPC ...... *H05K 1/0268* (2013.01); *H05K 2201/0909* (2013.01); *H05K 2201/09127* (2013.01); *H05K 2203/175* (2013.01)
USPC ............ 324/763.01; 324/750.01; 324/756.07; 324/757.02; 361/679.02; 439/620.06
(58) Field of Classification Search
CPC ........... H05K 1/0213; G01R 31/2805–31/282; G01R 19/0092; G01R 31/31718
USPC ........ 324/763.01–763.02; 361/679.02–679.6; 439/620.06
See application file for complete search history.

(56) References Cited

U.S. PATENT DOCUMENTS

| 7,103,183 | B2 * | 9/2006 | Okabe et al. ................... 380/59 |
| 2004/0018373 | A1 | 1/2004 | Suzuki et al. |
| 2005/0139055 | A1 | 6/2005 | Higuchi et al. |
| 2005/0155789 | A1 | 7/2005 | Suzuki et al. |
| 2008/0083116 | A1 | 4/2008 | Higuchi et al. |

FOREIGN PATENT DOCUMENTS

| AU | 1142627 | * | 2/1969 | ............... H05K 1/02 |
| CN | 2311004 | | 3/1999 | |
| CN | 2686276 | | 3/2005 | |
| CN | 1630455 | | 6/2005 | |
| CN | 101806168 | | 8/2010 | |

(Continued)

OTHER PUBLICATIONS

Abstract of JP 09-309110 published Dec. 2, 1997.

(Continued)

*Primary Examiner* — Melissa Koval
*Assistant Examiner* — Emily Chan
(74) *Attorney, Agent, or Firm* — Harness, Dickey & Pierce, P.L.C.

(57) ABSTRACT

A circuit board includes a main part on which a processor is mounted, a cut part to be cut off from the main part at a cut section before the board is reused, and a conductor pattern wired through the cut part via the cut section and to be cut off into a plurality of patterns at the cut section as the cut part is cut off. The processor detects a difference in signal level between a level of a signal output from the conductor pattern before the cut part is cut off, and a level of the signal output from the conductor pattern after the cut part is cut off, to determine a number of times the board is reused.

16 Claims, 8 Drawing Sheets

(56) References Cited

FOREIGN PATENT DOCUMENTS

| JP | 04-261084 | 9/1992 |
|---|---|---|
| JP | 04362084 A | 12/1992 |
| JP | 09309110 A | 12/1997 |
| JP | 2002288313 A | 10/2002 |
| JP | 2006137523 A | 6/2006 |

OTHER PUBLICATIONS

Abstract of JP 2002-288313 published Oct. 4, 2002.
Abstract of JP 2006-137523 published Jun. 1, 2006.
Abstract of JP 04-362084 published Dec. 15, 1992.
Chinese Office Action mailed Feb. 8, 2014.

* cited by examiner

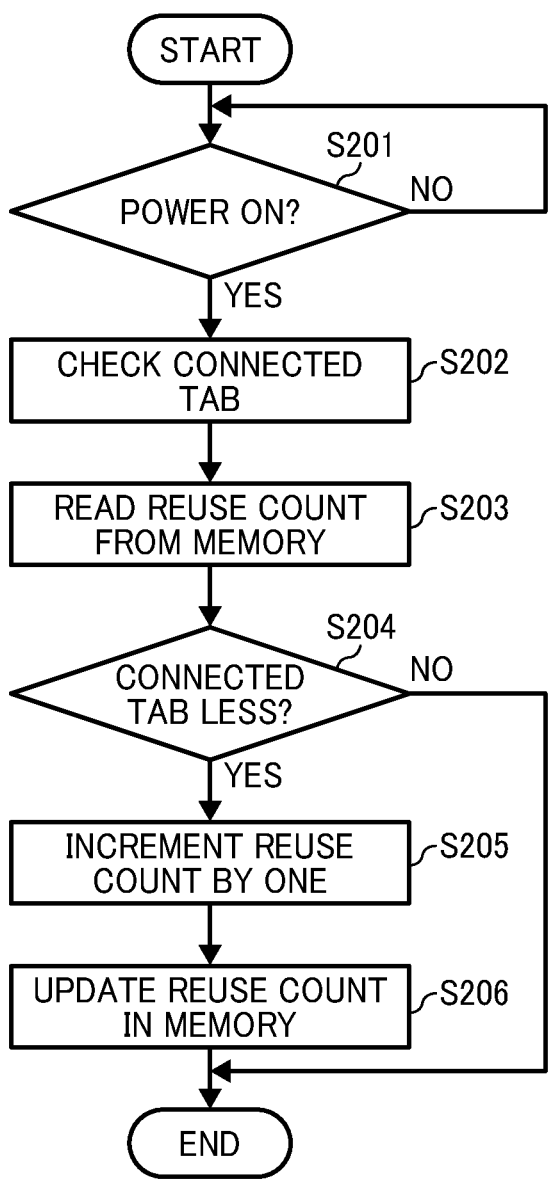

CIRCUIT BOARD, IMAGE FORMING APPARATUS, AND METHOD OF MANAGING REUSE INFORMATION OF CIRCUIT BOARD

CROSS-REFERENCE TO RELATED APPLICATIONS

This patent application is based on and claims priority pursuant to 35 U.S.C. §119 to Japanese Patent Application Nos. 2011-061453, filed on Mar. 18, 2011, and 2011-266025, filed on Dec. 5, 2011, in the Japan Patent Office, the entire disclosure of which is hereby incorporated herein by reference.

BACKGROUND

1. Field

The present invention generally relates to a circuit board, image forming apparatus having the circuit board, and method of managing reuse information such as a number of times the circuit board is reused, and more specifically, a circuit board having a structure such that information regarding reuse of the board is easily obtained.

2. Background

With the increased awareness of environmental issues, when an image forming apparatus is no longer in use, a circuit board on which electronic circuits are mounted is usually taken out from the apparatus for reuse. For example, a central processing unit (CPU) mounted on a printed circuit board or a printer engine board may be incorporated into a new image forming apparatus.

On the other hand, if the board is reused without checking the lifetime of electronic components mounted on the board, a trouble such as fire may occur due to the electronic component that has exceeded its lifetime. To make selection of the electronic component that has exceeded its lifetime easy, a number of times the board is reused may be tracked, for example, by marking the board or attaching a seal to the board. While this technique allows a user to easily check a number of times the board is reused by eyesight, the marking or seal itself may contain wrong information by error. Further, once the marking is erased or the seal is separated from the board, the board itself is not able to check how many times the board has been reused such that it may encourage the illegitimate use of the board.

Japanese Patent Application Publication No. 2006-137523 discloses a recycle system, which stores history information regarding each part on a radio frequency identification (RFID) tag attached to each part. The information stored in the REID tag is used to determine whether each part can be reused. Using this recycle system, the board may be able to check how many times each part on the board is reused based on information stored in the RFID tag. On the other hand, this does not allow the user to visually check whether the board is reused or how many times the board is reused.

SUMMARY

In view of the above, one aspect of the present invention is to provide a circuit board capable of detecting a number of times the board is reused by the board itself, while allowing a user to visually check a number of times the board is reused.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 14 is a flowchart illustrating operation of detecting a number of times the board is reused, performed by a processor mounted on the board, according to an example embodiment of the present invention.

Figure 1:
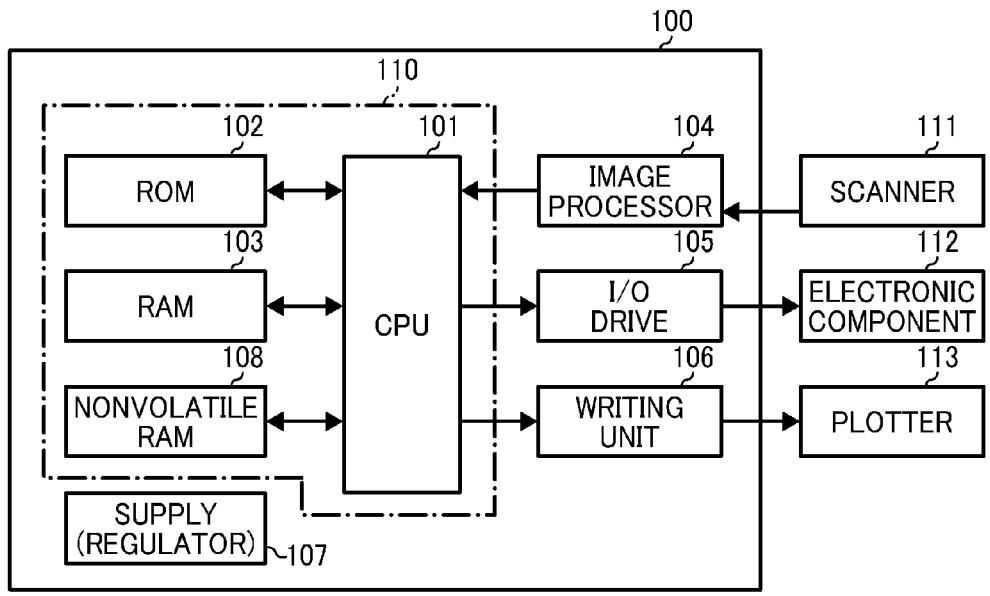
FIG. 1 is a schematic block diagram illustrating a hardware structure of a control section of an image forming apparatus having a printed circuit board, according to an example embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

Referring now to FIG. 1, a structure of a control section of an image forming apparatus is explained according to an example embodiment of the present invention. The image forming apparatus of FIG. 1 is implemented by a copier.

The image forming apparatus of FIG. 1 includes a main body 100, a scanner 111, a plotter 113, and other various devices that may be referred to as an electronic component 112. The main body 100 includes a control board 110, an image processor 104, an input/output (I/O) drive 105, and a writing unit 106. The control board 110 is provided with a central processing unit (CPU) 101 that controls entire operation of the image forming apparatus. The control board 100 additionally includes a read only memory (ROM) 102 that stores a control program to be used by the CPU 101, a random access memory (RAM) 103 that functions as a work memory of the CPU 101, and a nonvolatile RAM 108 that stores various data. More specifically, in this example, the control board 110 is implemented by a print circuit board, which may be referred to as the board 110 in this specification.

The image processor 104 applies specific image processing to scanned data read by the scanner 111 to generate processed image data. The I/O drive 105 drives various devices ("electronic component 112") such as a sensor, motor, heater, fan, and laser power source such as a light emitting diode (LED). The plotter 113 forms an image on the recording sheet based on the processed image data, and includes various devices such as a laser diode (LD) or an ink head. The writing unit 106 controls the plotter 113 to form an image on the recording sheet such as by toner or ink. The main body 100 further includes a regulator 107 that supplies electric power to the image forming apparatus, which is provided on a board that is different from the board 110. The image processor 104, the I/O drive 105, and the writing unit 106 are respectively mounted on an image processor board, an I/O drive board, and a writing unit board, each of which is provided with a CPU.

The board incorporated in the image forming apparatus of FIG. 1 may be taken out from the apparatus to be reused. For example, while the lifetime of the image forming apparatus such as the copier of FIG. 1 is about 5 years, the board in the apparatus may have a longer lifetime. The board, which is taken out from the apparatus, can be reused as long as some conditions are taken into account. The conditions to be considered include: (1) electronic components relating to electric power supply or driver such as electrolytic capacitors gradually degrade due to ripple current emissions; (2) writable memories such as an EEPROM may return an error when a number of times the memory is rewritten exceeds a previously set number; and (3) drivers for driving components that tend to consume a large amount of electric power such as motors or solenoids degrade due to heat generated when the motors or solenoids are driven. Based on the above-described conditions, a number of times the board can be reused is usually limited to a certain number. This suppresses occurrence of a trouble such as fire. Accordingly, information regarding reuse of the board such as a number of times the board is reused, and/or information indicating the illegitimate use of the board, needs to be managed. In the following examples, the board 110, which may be taken out from the image forming apparatus of FIG. 1, has a structure such that a number of times the board is reused can be easily detected either visually or electrically, while suppressing the board to be illegitimately reused.

More specifically, the board 110 is provided with at least one cut section through which a conductor pattern is wired. The board 110 is mainly classified into a main part and a cut part by a cut line that crosses the cut section. The main part is a part where electric circuits as the CPU 101 are mounted. The cut part is an edge part of the board 110. When the cut section is cut along the cut line, the cut part is cut off from the main part of the board 110 to cause the conductor pattern that is wired through the cut section to be cut off. Further, the cut section has a structure that allows a user to easily cut off the cut part at the cut section without using any tool. When the cut part is cut off at the cut section, the CPU 101 on the board 110 reads a signal output from the conductor pattern being cut to detect the change in signal level, with respect to a signal output from the conductor pattern before being cut. Assuming that a plurality of cut parts are provided, based on the detected signal change, the CPU 101 detects a number of cut parts that is cut off from the board 110, which corresponds to a number of times the board 110 is reused. The CPU 101 further determines whether to reuse the board 110 based on the detected number of times that board 110 is reused. Further, since the cut part is cut off from the main part before being reused, that is, after being used, the user can visually check how many times the board 110 is reused.

Figure 2:
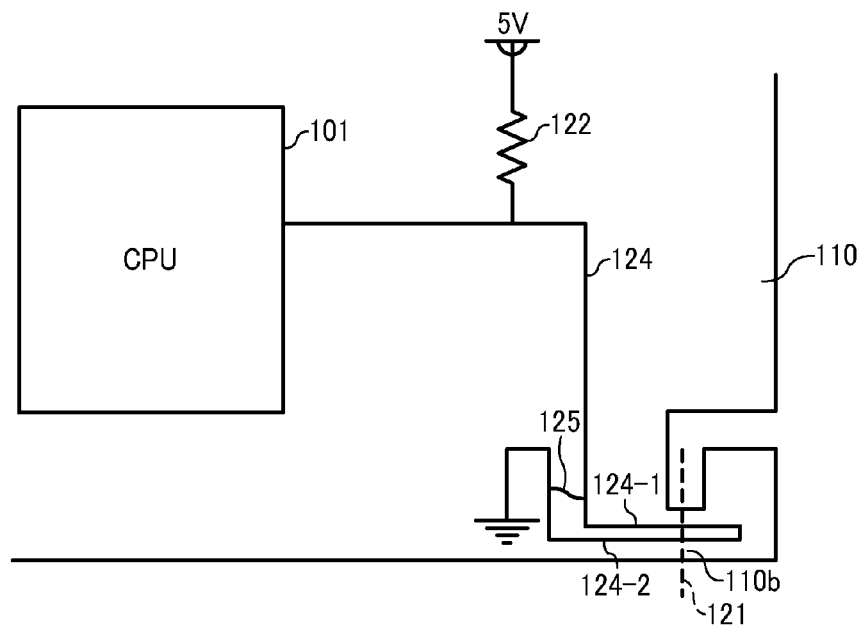
FIG. 2 is a schematic diagram illustrating a portion of the printed circuit board that may be taken out from the image forming apparatus of FIG. 1, according to an example embodiment of the present invention.
Figure 3A:
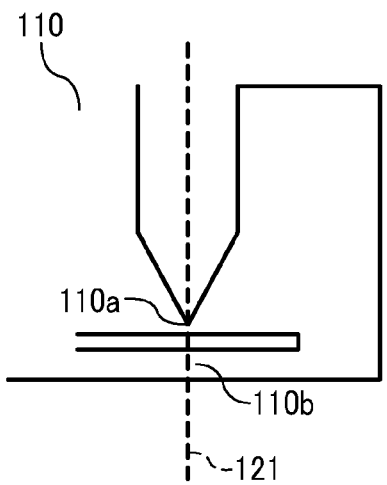
FIGS. 3A and 3B are an illustration of example shapes of a peripheral portion of a cut section of the board of FIG. 2.
Figure 3B:
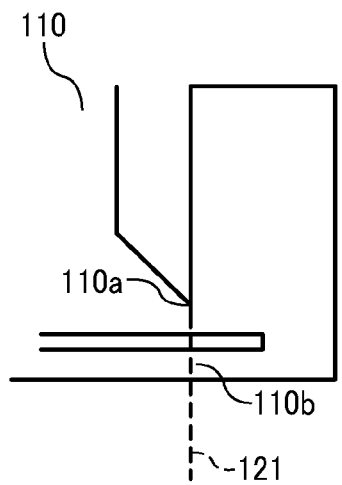
Figure 4:
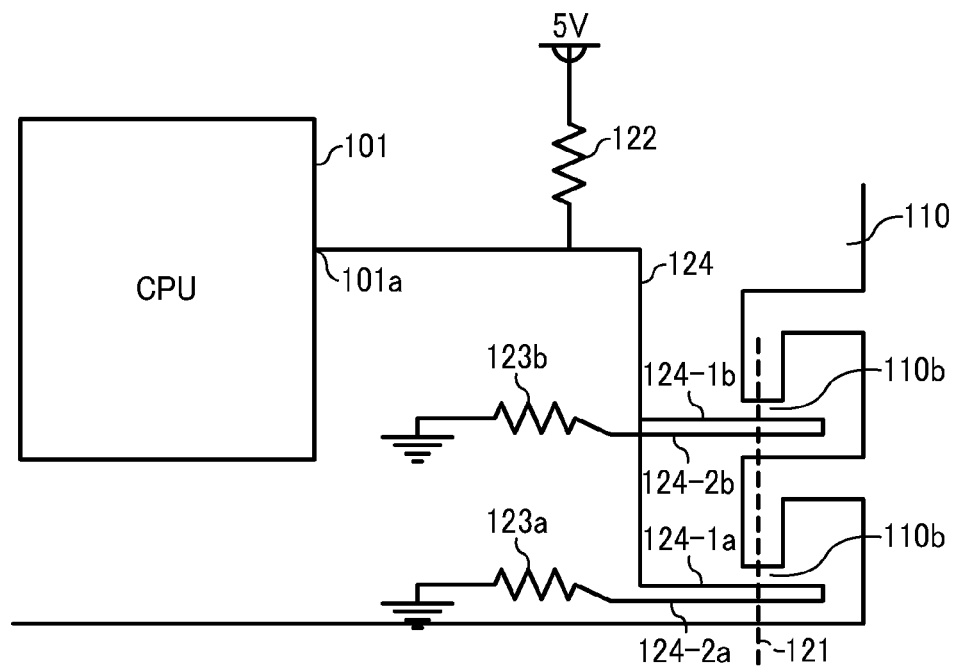
FIG. 4 is a schematic diagram illustrating a portion of the printed circuit board that may be taken out from the image forming apparatus of FIG. 1, according to an example embodiment of the present invention.

FIG. 2 is a schematic diagram illustrating a portion of the board 110 having a cut section. FIGS. 3A and 3B each illustrate an example shape of the cut section of the board 110. FIG. 4 is a schematic diagram illustrating a structure of the board 110 having a plurality of cut sections.

In this example, the CPU 101 of the board 110 determines whether the board 110 can be reused, based on the level of a signal, such as a voltage signal, which is output from a conductor pattern of the board 110 after the board 110 is cut before being reused. More specifically, as illustrated in FIG. 2, the board 110 is cut at a cut section 110b along a cut line 121 (indicated by the dotted line) into two parts: the main part on which the CPU 101 is mounted; and the cut part located at the edge side of the board 110. When the board 110 is cut along the cut line 121 at the cut section 110b, a conductor pattern 124 that runs through the cut section 110b and connected at the cut part is also cut off into a first pattern 124-1 and a second pattern 124-2. As the conductor pattern 124 is cut, the level of a signal, such as a voltage signal, output from the conductor pattern 124 is changed. As illustrated in FIG. 2, the first pattern 124-1 of the conductor pattern 124 is connected to an input terminal of the CPU 101. The second pattern 124-2 of the conductor pattern 124 is connected to a ground (GND)). The first pattern 124-1 is further connected to a pull up resistor 122 such that its voltage is pulled up at a voltage level of 5V. With this circuit structure, the level of signal output from the conductor pattern 124 changes from a low level to a high level as the conductor pattern 124 is cut, as described below referring to FIG. 6.

Further, in this example, the first pattern 124-1 of the conductor pattern 124 is wired through an inner layer of the board 110. This prevents an unauthorized user from soldering a jumper wire 125 to the board 110 through the first pattern 124-1 to illegitimately change information regarding a number of times the board 110 is reused.

As illustrated in FIG. 3A and FIG. 3B, the board 110 may be formed into a shape such that the board 110 can be easily cut at the cut section 110b into two parts. In FIGS. 3A and 3B, the board 110 is provided with an angular section 110a. The angular section 110a is a slanted surface slanted toward the cut section 110b, which is made thin, such that stress is concentrated on the cut section 110b. With this angular section 110a, the board 110 is easily cut off at the cut section 110b as force is exerted along the cut line 121. As illustrated in FIG. 3A, the angular section 110a may be provided respectively at the main part and the cut part. As illustrated in FIG. 3B, the angular section 110a may be provided at the main part.

Additionally, as illustrated below referring to FIGS. 12A to 12D, a surface 202s of the cut section 110b on which the conductor pattern 124 is not formed may be partially cut to form a V-shaped cut 202v, or a V-shaped groove. The board 110 is easily cut off at the cut section 110b, as it is folded at the V-shaped cut 202v. As described above, the board 110 is cut off at the cut section 110b before the CPU 101 detects a number of times the board 110 is reused, that is, after the board 110 is used at least once. Accordingly, the user is able to easily determine that the board 110 that is cut off has been used at least once by visually checking a shape of the board 110.

Further, since the board 110 may be reused more than once, the board 110 may be provided with a plurality of cut sections 110b each of which is used to assist a user to easily cut off the cut part from the main part of the board 110. In such case, the CPU 101 may be provided with a plurality of input terminals each corresponding to one of the plurality of cut sections 110b, or one of the plurality of cut parts. Alternatively, as illustrated in FIG. 4, the CPU 101 may be provided with an analog/digital (A/D) conversion terminal 101a. The CPU 101 may detect a number of times the board 110 is reused, based on a level of a signal, such as a voltage signal, which is input through the A/D conversion terminal 101a.

In the example case of FIG. 4, the board 110 is provided with two cut sections 110b, each of which helps a user to easily cut off the cut part from the main part along the cut line 121. The conductor patterns 124, which are connected in parallel, are connected to a ground via a first resistor 123a and a second resistor 123b, respectively. As the cut part is cut off at the first cut section 110b, the conductor pattern 124 that runs through the first cut section 110b is cut into the first pattern 124-1a and the second pattern 124-2a. The first pattern 124-1a is connected to the A/D terminal 101a of the CPU 101, and the second pattern 124-2a is connected to the ground via the resistor 123a. The CPU 101 detects a level of a voltage signal input to the A/D terminal 101a through the first pattern 124-1a. Before the cut part is cut off, that is, before the conductor pattern 124 is cut off, the signal reflecting a voltage level that is divided by the resistor 123a is input to the A/D terminal 101a through the second pattern 124-2a and the first pattern 124-1a. After the cut part is cut off, that is, after the conductor pattern 124 is cut off, the signal that is pulled up by the resistor 122 and reflects a voltage level that is not divided by the resistor 123a is input to the A/D terminal 101a through the first pattern 124-1a, such that the CPU 101 detects the change in signal level.

As the cut part is cut off at the second cut section 110b, the conductor pattern 124 that runs through the second cut section 110b is cut into the first pattern 124-1b and the second pattern 124-2b. The first pattern 124-1b is connected to the A/D terminal 101a of the CPU 101, and the second pattern 124-2b is connected to the ground via the resistor 123b. The CPU 101 detects a level of a voltage signal input to the A/D terminal 101a through the first pattern 124-1b. Before the cut part is cut off, that is, before the conductor pattern 124 is cut off, the signal reflecting a voltage level that is divided by the resistor 123b is input to the A/D terminal 101a through the second pattern 124-2b and the first pattern 124-1b. After the cut part is cut off, that is, after the conductor pattern 124 is cut off, the signal that is pulled up by the resistor 122 and reflects a voltage level that is not divided by the resistor 123b is input to the A/D terminal 101a through the first pattern 124-1b, such that the CPU 101 detects the change in signal level.

As described above, the signal level decreases as a number of resistors 123 each connecting the pattern 124 to the ground increases. By detecting the change in signal level, the CPU 101 is able to detect a number of cut parts that are cut off, that is, a number of times the board 110 is reused. Further, in this example, the resistor value may be made different for each of the resistors 123a and 123b, depending on its position on the board 110. Since the signal level changes according to the resistor value that is set for each of the resistors 123a and 123b, as long as the signal level or the signal pattern is detected, the CPU 101 is able to detect which portion of the board 110 is cut off by analyzing the degree of change in signal level.

Figure 5:
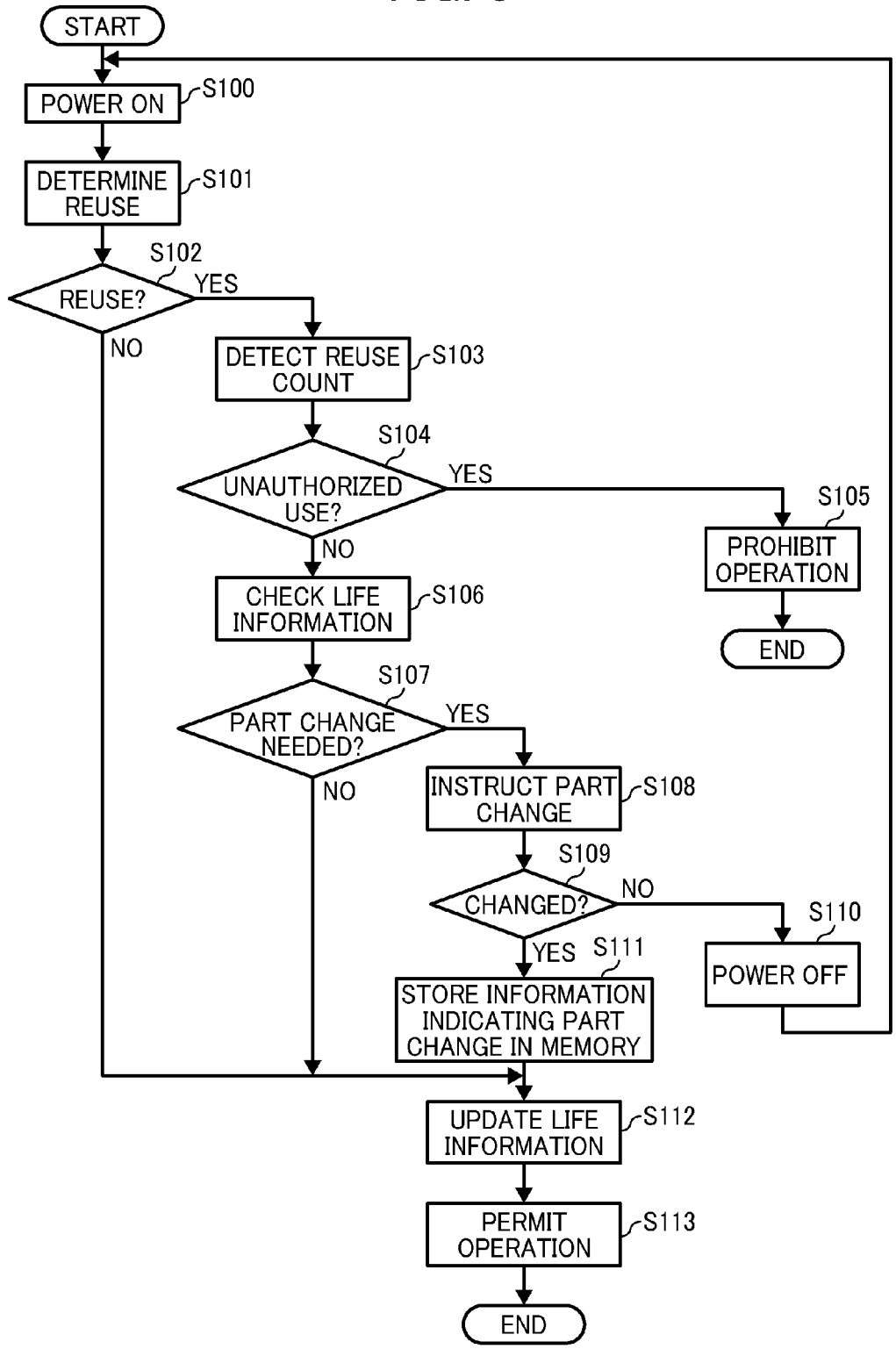
FIG. 5 is a flowchart illustrating operation of detecting a number of times the board is reused, performed by a processor mounted on the board, according to an example embodiment of the present invention.

Referring now to FIG. 5, operation of detecting a number of times the board 110 is reused, performed by the CPU 101 mounted on the board 110, is explained according to an example embodiment of the present invention. For example, operation of FIG. 5 is performed after the board 110 is collected at a recycle center and the cut part is cut from the board 110. Before the cut part is cut, the CPU 101 of the board 110 may be caused to obtain a level of a signal output from the conductor pattern 124.

At S100, the board 110 is supplied with electric power.

At S101, the CPU 101 starts operation of detecting a number of times the board 110 is reused. More specifically, the CPU 101 starts monitoring a level of signal input to the CPU 101 from the conductor pattern 124 through the terminal.

At S102, the CPU 101 determines whether the board 110 has been reused. When it is determined that the board 110 has not been reused ("NO" at S102), the operation proceeds to S112. Whether the board 110 is reused or not may be determined based on whether the cut part of the board 110 is cut off. More specifically, as described above referring to FIGS. 2 and 4, the CPU 101 determines that the board 110 is reused based on a level of signal output from the conductor pattern 124 through the terminal. When there is any change in the signal level, the CPU 101 determines that the board 110 is reused.

At S112, the CPU 101 updates life information of the board 110. For example, the CPU 101 updates the life information of the board 110, which is stored in the nonvolatile RAM 108. The life information of the board 110 includes information regarding the degree of usage of each part mounted on the board 110, and reuse information indicating a number of times the board 110 is reused.

At S113, the CPU 101 permits the board 110 to operate, i.e., to be reused, and the operation ends.

When it is determined that the board 110 has been reused ("YES" at S102), the operation proceeds to S103. At S103, the CPU 101 detects a number of times the board 110 is reused. For example, as described above referring to FIGS. 2 and 4, the CPU 101 detects a number of times the board 110 is reused based on a level of signal input to the CPU 101 from the conductor pattern 124 through the terminal.

At S104, the CPU 101 further determines whether the board 110 has been illegitimately used. For example, the CPU 101 refers to the nonvolatile RAM 108 to check for reuse information indicating a number of times the board 110 is reused before performing operation of FIG. 5. The CPU 101 further determine whether the detected number of times the board 110 is reused matches a stored number of times the board 110 is reused. The detected number of reused times is obtained at S103, based on a detected signal level. The stored number of reused times is obtained from reuse information that is stored in the nonvolatile RAM 108. More specifically, since the stored number of reuse times reflects a number of times the board 110 is reused before performing operation of FIG. 5, the stored number of reuse times is supposed to be less than the detected number of reuse times by one. When the detected number of reused times does not match the stored number of reused times, the CPU 101 determines that the board 110 has been illegitimately used ("YES" at S104), and the operation proceeds to S105 to prohibit the board 110 to operate. For example, referring back to FIG. 2, an unauthorized user may have soldered the jumper wire 125 to the pattern 124 at the cut section 110*b* to change information regarding the number of reused times. When the detected number of reused times matches the stored number of reused times, the CPU 101 determines that the board 110 has not been illegitimately used ("NO" at S104), and the operation proceeds to S106.

At S106, the CPU 101 checks life information to determine the degree of usage, or degradation, of each electronic part mounted on the board 110. Based on the life information, the CPU 101 may determine to replace one or more parts of the board 110. For example, any part on the board 110 may be previously set to be replaced with a new part when the detected number of reused times for that part, or the board 110, reaches a predetermined number. Alternatively, any part of the board 110 may be replaced with a new part based on various other information including, for example, the accumulated time in which electric power is supplied to the board 110, accumulated time in which printing is performed through the board 110, a number of recording sheets that are processed by the board 110, and a number of times a memory such as the nonvolatile RAM 108 is re-written.

When it is determined that one or more parts is to be replaced ("YES" at S107), the operation proceeds to S108. At S108, the CPU 101 allows a user to instruct replacement of one or more parts using an operation device or a debug monitor.

At S109, the CPU 101 determines whether any part to be replaced has been replaced. When it is determined that the part to be replaced has been replaced ("YES" at S109), the operation proceeds to S111 to store information indicating installation of a new part in a memory. At S112, the CPU 101 updates the life information of the board 110. At S113, the CPU 101 permits the board 110 to operate, and the operation ends.

When it is determined that the part to be replaced has not been replaced ("NO" at S109), at S110, the CPU 101 stores information indicating the usage of the part to be replaced, without resetting such information. More specifically, for the part to be replaced, the CPU 101 stores information indicating the usage of the part that is counted from the time the board 110 is re-used, and information indicating the accumulated usage of the part without resetting information that is stored before preparing for re-use. With this information indicating the accumulated usage of the part, the CPU 101 is able to determine whether to replace that part for the next time the operation of FIG. 5 is performed.

More specifically, when the part is replaced ("YES" at S109), the CPU 101 stores information indicating that the part is replaced at S111, and updates the life information of the board 110 at S112. When the part is not replaced ("NO" at S109), the CPU 101 turns off the power of the board 110 at S110, and the operation ends.

Assuming that the part to be replaced has been replaced after the operation ends, and that the CPU 101 starts operation of FIG. 5 again, the CPU 101 determines that there is the part to be replaced at S107 based on information regarding the part that has not been reset. At S109, when the CPU 101 determines that the part to be replaced has been replaced, the CPU 101 updates the life information of the part that is replaced.

As described above, the board 110 is provided with at least one cut part, which is easily cut off along a cut line that crosses a cut section, even without using a tool. As the cut part is cut off at the cut section, the conductor pattern 124 that is wired through the cut section is also cut off at the cut section. In the example case illustrated in FIG. 2 or 4, since the conductor pattern 124 has two signal lines that run through the cut section, the conductor pattern 124 is cut off at two points into two patterns. After the cut part is cut off at the cut section from the main part of the board 110, the CPU 101 mounted on the board 110 reads a signal level output from the conductor pattern 124 that is also cut off to detect a number of times the board 110 has been reused. For example, the CPU 101 may detect the change in signal level between low and high, or the change in voltage level.

Further, since at least a portion of the conductor pattern 124 is wired through the inner layer of the board 110, it would be difficult to connect the pattern 124 at one end after the cut part is cut off, thus preventing a user to illegitimately connect a wire to the pattern 124. Further, the board 110 having a portion being cut off is easily recognizable by eye-sight such that the user instantly knows the board 110 is re-used. The board 110 may be provided with a plurality of cut parts each of which may be cut off each time the board 110 is re-used. In such case, the user instantly knows a number of times the board 110 is re-used by counting a number of the cut parts being cut off.

Figure 6:
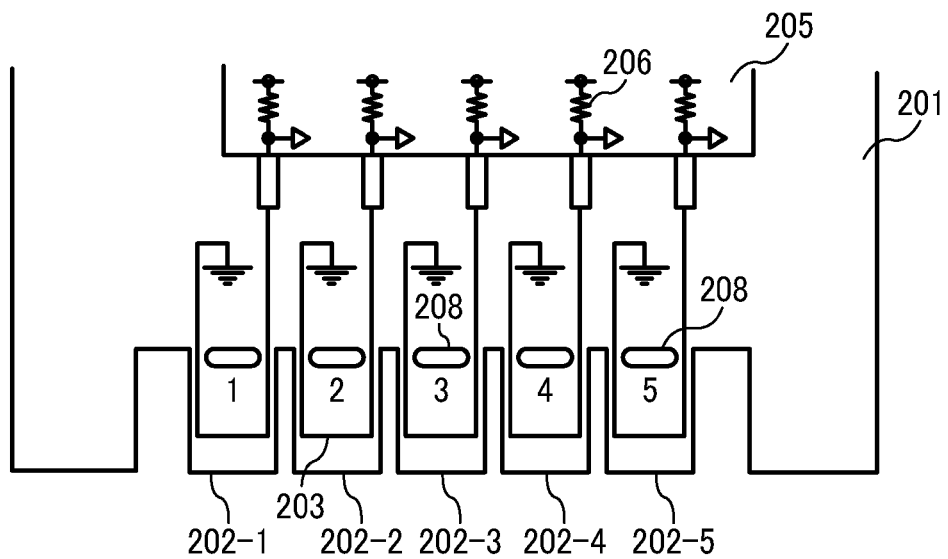
FIG. 6 is a schematic diagram illustrating a portion of the printed circuit board that may be taken out from the image forming apparatus of FIG. 1, according to an example embodiment of the present invention.

FIG. 6 is a schematic diagram illustrating a circuit structure of a portion of a printed circuit board 201 having a plurality of cut sections, according to an example embodiment of the present invention. The printed circuit board 201 may be incorporated in any apparatus such as the image forming apparatus of FIG. 1 to control operation of the apparatus. The printed circuit board 201 is simply referred to as the board 201 in this specification.

Figure 7:
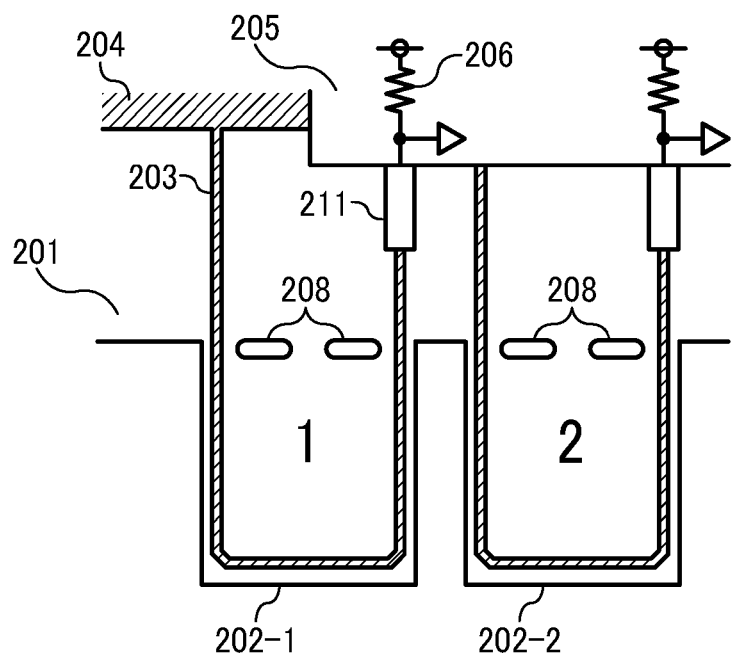
FIG. 7 is an enlarged view illustrating a conductor pattern of the portion of the printed circuit board of FIG. 6, when a resistor is provided inside of the an integrated circuit of the board.

In this example, the printed circuit board 201 is provided with a plurality of cut parts 202-1, 202-2, 202-3, 202-4, and 202-5 at the edge sides of the board 201. The cut parts 202-1 to 202-5 may be collectively referred to as the tab 202. Before the board 201 is reused, the tab 202 is easily cut off at the cut section from the main part of the board 201 on which an integrated circuit (IC) 205 is mounted. In this example, the IC 205 may function as the CPU. The cut section is formed by perforation such that each cut section is provided with one or more small holes 208 through perforation. The board 201 is provided with a conductor pattern 203 (FIG. 7) that is wired through the cut section and the tab 202. As illustrated in FIG. 7, for each of the cut sections or the tabs 202, the conductor pattern 203 is connected to a ground (GND)) 204 at one end, and to an input terminal 211 of the IC 205 at the other end. The conductor pattern 203 is further connected to a pull up resistor 206, which is provided within or outside the IC 205, such that its voltage is pulled up at a source voltage level. Since fives tabs 202 are provided, the board 201 can be reused up to five times.

When the tab 202 is not cut off such that it is attached to the main part of the board 201, as the power is turned on, the IC 205 is input with a signal having a low level through the input terminal 211 as the pattern 203 is connected to the ground GND 204. After the tab 202 is cut off from the main part of the board 201, the IC 205 is input with a signal having a high level through the input terminal 211 due to the pull up resistor 206 connected to the pattern 203. With this change in signal level, the IC 205 is able to determine whether the cut part is cut off, that is, whether the board 201 is reused. Further, the user is able to visually check whether the tab 202 is attached to or is cut off from the board 201 to determine whether the board 110 is reused.

The tab 202 that has been cut off from the board 201 is not easily attached back to the board 201. This indicates that a number of times the board 201 is reused can be easily managed by checking a number of the tabs 202 on the board 201 or a number of the tabs 202 cut off from the board 201. For example, the board 201 that is taken out from the apparatus is collected at a recycle center. The person at the recycle center can visually check a number of tabs 202 to determine how many times the board 201 is reused. Based on the detected number of reuse times, the person is able to determine whether the board 201 should be disposed as the lifetime of the board 201 has exceeded, or the board 201 can be reused.

While the number of reuse times can be visually checked, the board 110 that is not supposed to be reused may be classified as the board that is to be reused by human error. In view of this, as the power is supplied to a circuit of the board 110 during the evaluation process, the IC 205 automatically checks a number of the tabs 202 that are cut off to detect a number of reuse times, and alarms the user based on the detected number of reuse times. For example, the IC 205 may turn on an alarm light when the detected number of reuse times reaches a predetermined number. Based on information regarding the number of reuse times, the user may further determine whether to reuse the board 110 after changing the loads to some parts, such as by changing the drive characteristics of a drive circuit such as a motor.

FIG. 7 is an enlarged view illustrating the conductor pattern 203 that is wired through the cut section and the tab 202-1, before the tab 202-1 is cut off from the main part of the board 201. The signal that is transmitted through the conductor pattern 203 and input to the IC 205 has a low signal.

Figure 8:
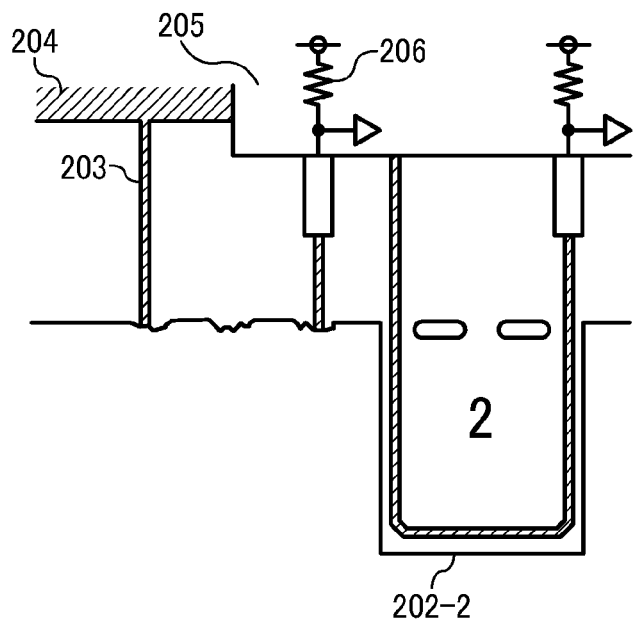
FIG. 8 is an enlarged view illustrating a conductor pattern of the portion of the printed circuit board of FIG. 6, after a cut part of the board is cut off at a out section of the board.

FIG. 8 is an enlarged view illustrating the conductor pattern 203 that is wired through the cut section and the tab 202-1, after the tab 202-1 is cut off from the main part of the board 201. As the pattern 203 is cut into two patterns at the cut section, the signal that is transmitted through the conductor pattern 203 and input to the IC 205 is pulled up by the pull up resistor 206 to have a high level.

Figure 9:
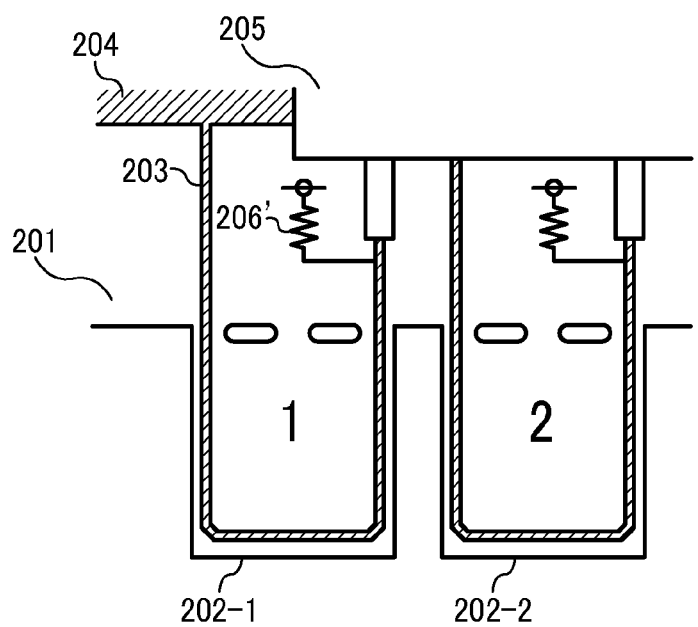
FIG. 9 is an enlarged view illustrating a conductor pattern of the portion of the printed circuit board of FIG. 6, when a resistor is provided outside of an integrated circuit of the board.

FIGS. 7 and 8, the pull up resistor 206 is provided within the IC 205. Alternatively, the pull up resistor 206 may be provided outside the IC 205 as illustrated in FIG. 9.

As described above, the board 201 includes at least one tab at an edge section of the board 201, which can be easily cut off at a cut section, and a conductor pattern 203 that is wired through the cut section and the tab that is connected to a ground (earth) at one end and to an input port of an electric circuit via a pull up resistor at the other end. When the tab 202 is attached to the board 201, the input port of the circuit is input with a low signal. After the tab 202 is cut off from the board 201, the input port of the circuit is input with a high signal. With this change in signal level, the board 201 itself is able to determine a number of times the board 201 is reused. Further, since the tab 202 that has been cut off cannot be easily attached back to the board 201, the user is able to visually check a number of times the board 201 is reused, based on a number of the tabs 202 that are cut off from the board 201.

As described above referring to FIGS. 2 to 9, the cut section is formed such that the cut part, or the tab, is easily cut off from the main part of the board using a simple tool or even by hand. Further, the cut section is formed such that the conductor pattern, which is wired through the cut section and the cut part, is cut off into two patterns at the cut section as the cut part is cut off.

Figure 10:
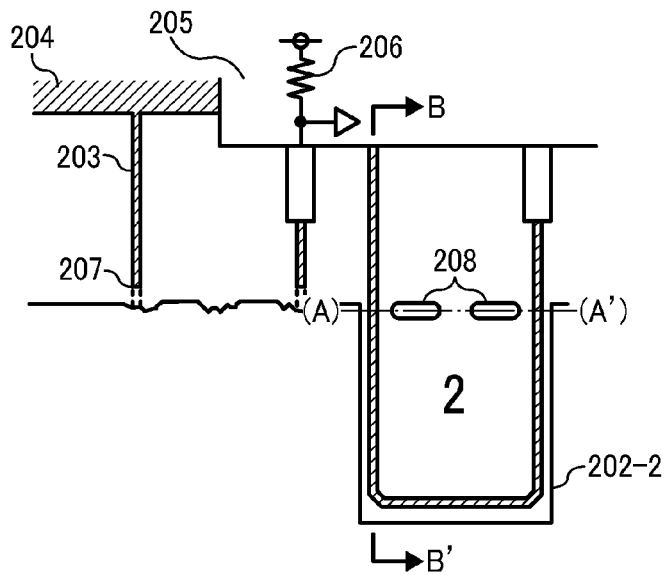
FIG. 10 is an enlarged view illustrating a conductor pattern of the portion of the printed circuit board of FIG. 6, when a cut part of the board is cut off at a section other than a cut section of the board.

FIG. 10 illustrates an example case in which the tab 202-1 of FIG. 7 is cut off from the board 201, for example, by hand. In the example case illustrated in FIG. 10, the conductor pattern 203 is not cut off along the cut line A-A' that crosses the cut section having the holes 208. In such case, the end 207 of the conductor pattern 203 may be lifted up from the board surface or fallen out from the board surface. This may make difficult for the IC 205 to read a signal output from the pattern 203.

Figure 11A:
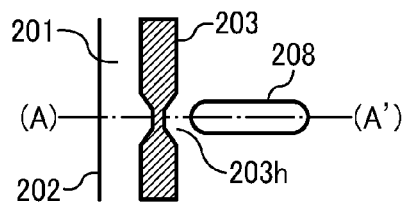
FIGS. 11A to 11C are an illustration of example shapes of a conductor pattern of the board of FIG. 6.

In order to suppress the conductor pattern 203 from being lifted up or fallen out from the board surface, the conductor pattern 203 may be formed into a shape such that it is easily cut off along the cut line A-A' without being lifted up or fallen out from the board surface. For example, as illustrated in FIG. 11A, the conductor pattern 203 is formed such that it has a narrow-width section 203h at the position where the cut line A-A' perpendicularly crosses. When the board 201 is folded or split at the cut section having the holes 208 along the cut line A-A', since the narrow-width section 203h is narrow or thinner, the conductor pattern 208 is easily cut off at the narrow-width section 203h.

More specifically, in this example, the width of the conductor pattern 203 ranges between 0.5 mm and 0.7 mm except for the narrow-width section 203h. The width of the conductor pattern 203 at the narrow-width section 203h ranges between 0.15 mm and 0.22 mm. Since the conductor pattern 203 is made narrower at the section along the cut line A-A', the conductor pattern 202 is easily cut off along the cut line A-A' without being lifted up or fallen out from the board 201, as the tab 202 is cut off. By making the width of the conductor pattern 203 narrower, strength of the conductor pattern 203 tends to decrease. Further, when the tab 202 is cut off, force tends to be exerted more on the narrow-width section 203h. In order to adjust strength of the conductor pattern 203 at the position where the cut line A-A' perpendicularly crosses, the width of the conductor pattern 203 is made smaller.

Figure 11B:
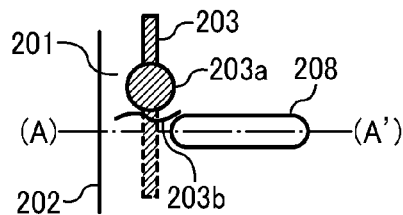

In another example, as illustrated in FIG. 11B, the conductor pattern 203 may be provided with a land, such as a conductor land pattern 203a having a diameter of about 1 mm, at the cut section, specifically, in a vicinity of the portion where the cut line A-A' perpendicularly crosses. The land 203a has a width, or the diameter, that is greater than that of the conductor pattern 203. Since the land 203a has a surface area greater than that of the conductor pattern 203, the land 203a tends to be attached to the board surface with greater power. As the cut part is cut off along the cut line A-A', a portion of the conductor pattern 203 wired on the main part is prevented from being taken off as the force exerted around the cut section is cancelled out by the absorption force of the land 203a. This causes the conductor pattern 203 to be cut off at the edge 203d of the land 203a.

Figure 11C:
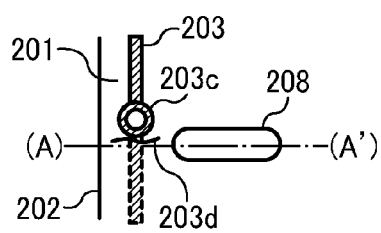

In another example, as illustrated in FIG. 11C, the conductor land pattern 203a of FIG. 11B, which has a circular shape, may be provided with a through-hole to form a through-hole land 203c. In this example, the through-hole land 203c having a diameter of about 1 mm is provided at the cut section, specifically, in a vicinity of the portion where the cut line A-A' perpendicularly crosses. Through the through-hole of the land 203c, a cylindrical body of metal is inserted, which is high in conductivity. As the cut part is cut off along the cut line A-A', a portion of the conductor pattern 203 wired on the main part is prevented from being taken off as the force exerted around the cut section 208 is cancelled out by the conductive force of the land 203c. This causes the conductor pattern 203 to be cut off at the edge 203d of the land 203c.

As described above referring to FIGS. 11A to 11C, the shape of the conductor pattern 203 at the cut section is adjusted to cause the conductor pattern 203 to be easily cut off at the cut section along the cut line.

Further, as described below referring to FIGS. 12A to 12D, the cut section may be formed with a V-shaped cut or a hole. FIGS. 12A to 12D each illustrate the cut part, or the tab 202, that is shown in FIG. 10 when cut along the line B-B'.

Figure 12A:
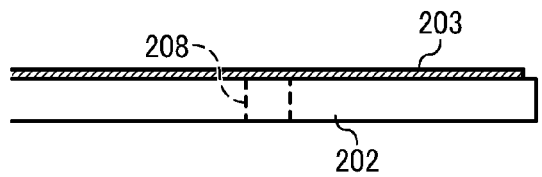
FIGS. 12A to 12D are an illustration for explaining a V-shaped cut or a hole of the cut section of the board of FIG. 6.

In one example, as described above referring to FIGS. 6 to 9, the cut section may be formed by perforation such that a plurality of holes are provided at the cut section along the cut line A-A'. In case the conductor pattern 203 needs to be formed on the board surface at the cut section, it is preferable to form the cut section by perforation, for example, as illustrated in FIG. 12A. More specifically, as illustrated in FIG. 12A, when the conductor pattern 203 is formed on the board surface of the cut part 202, a plurality of holes 208 is formed by perforation along that cut line A-A'. With this perforation, the cut section along the cut line A-A' is made weak, thus allowing the user to easily cut off the cut part 202 along the cut line A-A'.

In another example, as described above referring to FIGS. 2 to 4, the cut section may be provided with a V-shaped cut such as a V-shaped groove at a portion of the board surface through which the conductor pattern is not wired. With the V-shaped cut, the thickness of the board at the cut section where the cut line perpendicularly crosses is made small so as to allow the user to easily cut off the cut part from the main part of the board at the cut section.

Figure 12B:
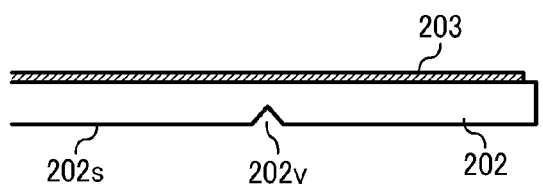
Figure 12C:
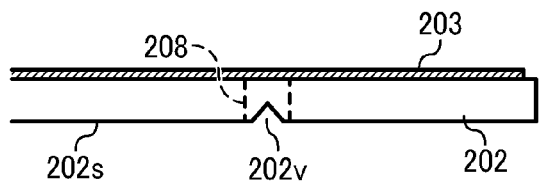
Figure 12D:
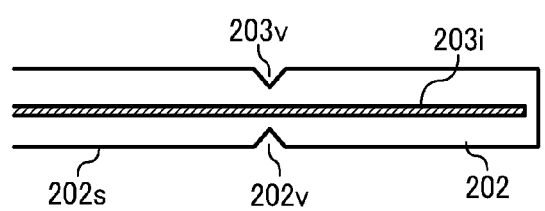

More specifically, as illustrated in FIGS. 12B and 12D, the surface 202s of the board 201 on which the conductor pattern 203 is not formed may be cut along the cut line A-A' to form the V-cut 202v having a predetermined depth. The depth of the V-shaped cut 202v is set based on the board thickness and strength of the cut part 202. As the cut part 202 is folded or split off along the V-shaped cut 202v, the cut part 202 is easily separated from the main part of the board 201.

In case the conductor pattern 203 is formed on the board surface, the V-shaped cut 202v cannot be formed on the board surface. In such case, as illustrated in FIG. 12B, the V-shaped cut 202v is formed on the surface 202s on which the conductor pattern 203 is not wired, in a direction that is perpendicular to the conductor pattern 203. Alternatively, as illustrated in FIG. 12C, both of the V-shaped cut 202v and the perforation holes may be provided at the cut section.

In case the conductor pattern is not formed on the board surface of the tab 202, for example, when the conductor pattern 203i is formed within the inner layer of the board 201, as illustrated in FIG. 12D, the V-shaped cut 203v and the V-shaped cut 202v are formed respectively on the surfaces of the board 201. Alternatively, the plurality of holes 208 may be formed by perforation along that cut line A-A'.

As described above, the cut section is provided with a V-shaped cut and/or a perforation hole to make the cut part to be easily cut off from the main part of the board even by hand. Further, the conductor pattern that is wired through the cut section has a shape that causes the conductor pattern to be easily cut off at a portion where the cut line perpendicularly crosses. This suppresses the board or the conductor pattern from being damaged as the cut part is cut off.

Figure 13:
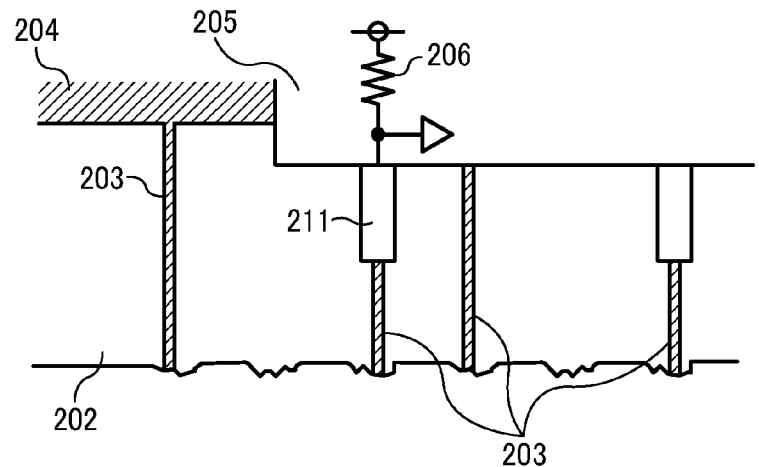
FIG. 13 is an enlarged view illustrating a conductor pattern of the portion of the printed circuit board of FIG. 6, after two cut parts of the board are respectively cut off at cut sections of the board.

FIG. 13 illustrates an example case in which the tab 202-1 and the tab 202-2 of FIG. 7 are respectively cut off from the main part of the board 201 having all the tabs 202. It is assumed that the user mistakenly cuts off the tab 202-2, which should not be cut off, from the board 201 after the board 201 is used once. In such case, while the user is able to determine a number of times the board 201 is reused based on a number of tabs 202 that are cut off, such information obtained based on the number of tabs 202 being cut off is not accurate. Further, since the signal change depends on the number of conductor patterns 203 that are cut off, the board 201 itself is not able to correct an error.

In such case, through causing a processor such as the IC 205 mounted on the board 201 to perform operation of FIG. 5, the processor is able to determine that the detected number of reuse times does not match the stored number of reuse times. Assuming that the stored number of reuse times, which is obtained from the memory, is accurate, the processor determines that the detected number of reuse times does not match the stored number of reuse times at S104. Since they do not match, the operation proceeds to S105 to prohibit reuse of the board. While this may prevent the reuse of the board, the board that is supposed to be reused will be disposed. It is thus preferable to accurately manage a number of times the board is reused, even when the detected number of times the board is reused cannot be accurately obtained.

Referring now to FIG. 14, operation of detecting a number of times the board is reused and correcting the number of times the board is reused, performed by the IC 205, is explained according to an example embodiment of the present invention. In this example, it is assumed that the tab 202-1 and the tab 202-2 are cut off from the board 201, while only the tab 202-1 is supposed to be cut off. Further, it is assumed that information regarding a level of the signal output from the conductor pattern 206 before the tabs 202-1 and 202-2 are cut off is previously obtained.

At S201, the IC 205 determines whether the board 201 is supplied with electric power. When electric power is supplied ("YES" at S201), the operation proceeds to S202. When electric power is not supplied ("NO" at S201), the operation repeats S201.

At S202, the IC 205 checks whether the cut part, the tab 202, is attached to the main part of the board 201 for each of the tabs 202. Based on the number of tabs 202 that are cut off, the IC 205 determines a number of times the board 201 is reused. More specifically, the IC 205 electrically detects the change in signal level output from the conductor pattern 206 to determine a number of tabs 202 that are cut off.

At S203, the IC 205 reads out reuse information indicating the number of times the board 201 is reused, which is previously stored before turning on the power at S201, from a nonvolatile RAM provided on the IC 205. The IC 205 is able to obtain a number of reuse times the board is reused by incrementing the stored number of times the board 201 is reused by one.

At S204, the IC 205 determines whether the detected number of reuse times is less than the number of reuse times obtained from the stored number of reuse times, by one or more than one. The detected number of reuse times is obtained at S202, based on the detected number of tabs 202 that are cut off. The number of reuse times is obtained at S203, based on reuse information that is previously stored. When it is determined that the detected number of reuse times is less than the number of reuse times by one or more than one ("YES" at S204), the operation proceeds to S205 to determine that a number of times the board 201 is reused is a number obtained by incrementing the detected number of reused times, one by one, until it reaches the number of reuse dines obtained at S203. At S206, the IC 205 updates the stored number of reuse times in the nonvolatile RAM to be equal to the number obtained by incrementing the corrected detected number of reuse times by one. When it is determined that the detected number of reuse times is not less than the number of reused times by one or more than one ("NO" at S204), the operation ends.

As described above, when the IC 205 determines that a number of reuse times that is detected from the board 201 does not match a number of reuse times that is stored, the IC 205 corrects the detected number of reuse times based on the stored number of reuse times.

As described above, the processor mounted on the board to be reused is capable of detecting a number of times the board is reused, based on the change in signal level output from a conductor pattern of the board. This improves the accuracy in managing reuse information regarding a number of times the board is reused, thus suppressing troubles such as fire that may be otherwise caused when the board that is supposed to be disposed is reused.

Further, since the user can visually check a number of cut parts that are cut off from the board, a number of times the board is reused, which corresponds to the number of cut parts that are cut off, can be detected without using any tool.

The board is provided with a cut section that allows the cut part to be easily cut off from the board, even by hand. The cut section may be provided with a V-shaped out and/or a hole. Further, as the cut part is cut off at the cut section, the conductor pattern that is wired through the cut part via the cut section is also cut off at the cut section. The conductor pattern may be formed into a shape such that it is easily cut off at the cut section.

Even when one or more cut parts are cut off by mistake, the processor mounted on the board is capable of correcting a detected number of times the board is reused, based on reuse information previously stored.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the spirit and scope of the present invention, and all such modifications are intended to be included within the scope of the present invention.

For example, elements and/or features of different illustrative embodiments may be combined with each other and/or substituted for each other within the scope of this disclosure and appended claims.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, nonvolatile memory cards, ROM (read-only-memory), etc.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

In one example, the present invention may reside in a circuit board, which includes at least one cut part to be cut off from the board before the board is reused, a conductor pattern that is wired through the cut part, and means for detecting the difference in signal level between a level of the signal output from the conductor pattern before the cut part is out off, and a level of the signal output from the conductor pattern after the cut part is cut off to output a detection result.

In the above-described example, the circuit board further includes means for counting a number of cut parts that are cut off from the board based on the detection result to output a detected number of times the board is reused.

In the above-described example, the circuit board further includes means for determining whether a number of times the board is reused is accurate based on the detected number of times the board is reused.

In the above-described example, the circuit board further includes means for correcting a number of times the board is reused using the stored number of times the board is reused, when the means for determining determines that the detected number of times the board is reused does not match the stored number of times the board is reused.

In the above-described example, the means for detecting includes an analog digital conversion terminal that is connected to the conductor pattern, and means for detecting the change in voltage input to the analog digital conversion terminal. The means for controlling detects the change in voltage that corresponds to a number of cut parts that are cut off as the difference in signal level.

In the above-described example, the means for detecting further includes a pull-up resistor that is connected to an input port that is connected to the conductor pattern. The conductor pattern is connected to the input port and a ground. The means for controlling detects the change in voltage input to the input port as the difference in signal level.

In one example, the pull-up resistor is incorporated in an integrated circuit provided with the analog digital conversion terminal or the input port. In one example, the pull-up resistor is provided outside the integrated circuit.

In one example, a cut section at which the cut part is cut off from the board is made thin.

In one example, the cut section at which the cut part is cut off from the board is provided with a V-shaped cut at a surface of the cut section having no conductor pattern formed thereon. The cut part is cut off from the board along a line that intersects the V-shaped cut of the cut section.

In one example, the cut section at which the cut part is cut off from the board is provided with a hole made by perforation at a surface of the cut section having no conductor pattern formed thereon. The cut part is cut off from the board along a line that intersects the hole of the cut section.

In one example, a width of the conductor pattern at a portion where a cut line perpendicularly crosses is made smaller than a width of the conductor pattern at a portion other than the portion where the cut line perpendicularly crosses.

In one example, the conductor pattern is formed with a land in a vicinity of the portion where the cut line perpendicularly crosses. In one example, the conductor pattern is formed with a through-hole in a vicinity of the portion where the cut line perpendicularly crosses.

The above-described circuit board may be implemented as a printed circuit board.

In another example, the present invention may reside in an image forming apparatus having the printed circuit board.

In another example, the present invention may reside in a method of detecting a number of times a circuit board is reused. The circuit board is previously provided with at least one cut part to be cut off from the circuit board before the board is reused, and a conductor pattern that is wired through the cut part. The method includes detecting the difference in signal level between a level of the signal output from the conductor pattern before the cut part is cut off, and a level of the signal output from the conductor pattern after the cut part is cut off to output a detection result.

In another example, the present invention may reside in a recording medium storing a plurality of instructions which, when executed, cause a processor to perform the above-described method of detecting a number of times a circuit board is reused.

What is claimed is:

1. A circuit board, comprising:
    a main part on which a processor is mounted;
    a cut part to be cut off from the main part at a cut section before the board is reused; and
    a conductor pattern wired through the cut part via the cut section and to be cut off into a plurality of patterns at the cut section as the cut part is cut off,
    wherein, when electric power is supplied, the processor detects a difference in signal level between a level of a signal output from the conductor pattern before the cut part is cut off, and a level of the signal output from the conductor pattern after the cut part is cut off to output a detection result, and wherein when the cut part includes a plurality of cuts parts, the processor further counts a number of one or more cut parts that are cut off from the main part of the board based on the detection result and obtains a detected number of times the board is reused based on the counted number of one or more cut parts that are cut off.

2. The circuit board of claim 1, wherein the processor further obtains reuse information from a memory, and compares the detected number of times the board is reused with a stored number of times the board is reused that is obtained from the reuse information to generate a comparison result, and
    when the comparison result indicates that the detected number of times the board is reused does not match the stored number of times the board is reused, the processor determines that at least one of the detected number of times and the stored number of times is inaccurate.

3. The circuit board of claim 2, wherein the processor further prohibits the circuit board to be reused when the processor determines that at least one of the detected number of times and the stored number of times is inaccurate.

4. The circuit board of claim 1, wherein:
    the conductor pattern is connected to the processor through an input terminal at one end and to a ground at the other end, and
    when the cut part is cut off at the cut section, the conductor pattern is cut into a first pattern connected to the processor through the input terminal and a second pattern connected to the ground such that the level of the signal input to the processor through the input terminal changes.

5. The circuit board of claim 4, wherein the input terminal is an analog digital conversion terminal.

6. The circuit board of claim 4, wherein:
    the conductor pattern is connected to the processor through the input terminal via a pull-up resistor, and
    when the cut part is cut off at the cut section, the level of the signal input to the processor through the input terminal is changed from a low level to a high level due to the pull-up resistor.

7. The circuit board of claim 6, wherein the pull-up resistor is incorporated in the processor.

8. The circuit board of claim 6, wherein the cut section is made thin so as to cause the cut part to be easily cut off from the main part at the cut section along a cut line.

9. The circuit board of claim 8, wherein the cut section includes a V-shaped cut at a surface of the cut section having no conductor pattern formed thereon so as to cause the cut part to be easily cut off along the cut line that intersects the V-shaped cut.

10. The circuit board of claim 8, wherein the cut section includes a hole made by perforation at a surface of the cut section having no conductor pattern formed thereon so as to cause the cut part to be easily cut off along the cut line that intersects the hole.

11. The circuit board of claim 8, wherein a width of the conductor pattern at a portion where the cut line perpendicularly crosses is made smaller than a width of the conductor pattern at a portion other than the portion where the cut line perpendicularly crosses.

12. The circuit board of claim 11, wherein the conductor pattern includes a land in a vicinity of the portion where the cut line perpendicularly crosses so as to cause the cut part to be easily cut off around an edge of the land.

13. The circuit board of claim 12, wherein the land includes a through-hole through which a cylindrical body including a metal is inserted so as to cause the cut part to be easily cut off around the edge of the land.

14. The circuit board of claim 6, wherein at least the portion of the conductor pattern is connected to the processor through an inner layer of the board.

15. An image forming apparatus, comprising:
    the circuit board of claim 1.

16. A method of managing reuse information of a circuit board, the circuit board including a main part on which a processor is mounted, a cut part to be cut off from the main part at a cut section before the board is reused, and a conductor pattern wired through the cut part via the cut section and to be cut off into a plurality of patterns at the cut section as the cut part is cut off, the method comprising:
    detecting a difference in signal level between a level of a signal output from the conductor pattern before the cut part is cut off, and a level of the signal output from the conductor pattern after the cut part is cut off to output a detection result
    counting a number of one or more cut parts that are cut off from the main part of the board based on the detection result, when the cut part includes a plurality of cut parts; and
    obtaining a detected number of times the board is reused based on the counted number of one or more cut parts that are cut off.

* * * * *